(12) United States Patent
Hasegawa

(10) Patent No.: US 7,619,293 B2
(45) Date of Patent: Nov. 17, 2009

(54) PIN PHOTODIODE WITH IMPROVED BLUE LIGHT SENSITIVITY

(75) Inventor: Akihiro Hasegawa, Hashima (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 11/443,005

(22) Filed: May 31, 2006

(65) Prior Publication Data
US 2006/0273358 A1     Dec. 7, 2006

(30) Foreign Application Priority Data
Jun. 3, 2005  (JP) .............................. 2005-164741

(51) Int. Cl.
*H01L 31/105* (2006.01)
(52) U.S. Cl. .................. 257/458; 257/459; 257/466
(58) Field of Classification Search ............. 257/213, 257/288, 290, 291, 458, 459, 466; 438/142, 438/151, 197, 585
See application file for complete search history.

(56) References Cited

U.S. PATENT DOCUMENTS

| | | | |
|---|---|---|---|
| 5,563,431 A * | 10/1996 | Ohmi et al. ............ | 257/291 |
| 6,114,740 A | 9/2000 | Takimoto et al. | |
| 6,376,871 B1 | 4/2002 | Arai | |
| 6,403,998 B1 * | 6/2002 | Inoue .................. | 257/292 |
| 6,649,951 B2 * | 11/2003 | Kozuka et al. ......... | 257/292 |
| 2003/0062581 A1 * | 4/2003 | Ahrens et al. .......... | 257/430 |
| 2005/0077577 A1 * | 4/2005 | Manna et al. ........... | 257/355 |
| 2006/0039666 A1 * | 2/2006 | Knights et al. ......... | 385/129 |
| 2006/0091489 A1 * | 5/2006 | Cheng et al. .......... | 257/458 |
| 2006/0261429 A1 * | 11/2006 | Hasegawa ............... | 257/458 |

FOREIGN PATENT DOCUMENTS

| | | |
|---|---|---|
| JP | A 10-107243 | 4/1998 |
| JP | A 2001-60713 | 3/2001 |
| WO | WO 2004044994 A2 * | 5/2004 |

OTHER PUBLICATIONS

Fortsch et al. "Integrated PIN Photodiodes in High-Performance BiCMOS Technology." (Feb. 2002), IEEE, IEDM pp. 801-804.*
Yang et al. "A High-Speed, High-Sensitivity Silicon Lateral Trench Photodetector." (Jul. 2002), IEEE Electron Device Letters, vol. 23, No. 7, pp. 395-397.*

* cited by examiner

*Primary Examiner*—Lynne A. Gurley
*Assistant Examiner*—Vernon P Webb
(74) *Attorney, Agent, or Firm*—Oliff & Berridge, PLC

(57) ABSTRACT

In a laser pickup photodetector of an optical disk playback device, the sensitivity to blue light is improved. On a main surface of a semiconductor substrate, a high resistivity epitaxial layer that becomes an i layer of a PIN photodiode (PIN-PD) is formed. On a surface of the epitaxial layer, two trenches are formed, on a surface of one trench an $N^+$ region that becomes a cathode region of the PIN-PD is formed, and on a surface of the other trench a $P^+$ region that becomes an anode region is formed. When the cathode region and the anode region are set in a reverse bias state, a light receiving semiconductor region that is an i layer between the cathode region and anode region is depleted. The depleted layer expands to a surface of the semiconductor substrate. Accordingly, for blue light having a short wavelength, signal charges can be generated on a surface of the semiconductor substrate and the cathode region can collect the signal charges and extract the charges as a light receiving signal.

17 Claims, 5 Drawing Sheets

(related art)

PIN PHOTODIODE WITH IMPROVED BLUE LIGHT SENSITIVITY

FIELD OF THE INVENTION

The invention relates to a semiconductor device that detects light with a light receiving portion made of a PIN (p-intrinsic-n) photodiode.

BACKGROUND OF THE INVENTION

In recent years, as an information recording medium, optical disks such as CDs (Compact Disks) and DVDs (Digital Versatile Disks) have become predominant. In a reproducing device of the optical disks, an optical pickup unit irradiates laser light along a track of an optical disk and detects reflected light thereof. Based on a variation in intensity of the reflected light, recorded data are reproduced.

An optical disk reproducing device, while detecting data based on the reflected light, servo-controls a positional relationship between the optical pickup unit and the optical disk. Specifically, a tracking servo that allows irradiation of the laser light along a centerline of the track and a focusing servo that can keep a distance between the optical disk and the optical pickup unit constant are implemented. For instance, in the focus servo control, based on an output signal of the photodetector that detects reflected laser light, an actuator variably controls a position of the optical pickup unit to maintain a distance d with the optical disk constant. As a result, an amount of reflected light corresponding to a displacement of a focus of irradiation light on a surface of the optical disk can be prevented from fluctuating and thereby noise superposed on the light receiving signal can be suppressed.

In order to obtain information for such servo control, as a photodetector, a semiconductor device where a reflected light image is divided into a plurality of segments and received is used. FIGS. 1 through 3 are schematic diagrams showing a light receiving portion of the photodetector and a reflected light image on the light receiving portion. Reflected laser light is input on the photodetector through a cylindrical lens. The reflected light has a circular section when it enters the cylindrical lens. According to a principle of an astigmatism method, an image of the reflected light after going through the cylindrical lens, in accordance with a distance d between the optical pickup unit and the optical disk, varies in a dimensional ratio in two perpendicular directions. Specifically, when a distance d is a target value, as shown in FIG. 2, an image of reflected light is set so as to be a perfect circle 30. On the other hand, for instance, when the distance d is excessive, as shown in FIG. 1, an image of reflected light becomes a vertically long ellipse 32 and, when the distance d is insufficient as shown in FIG. 3, an image of reflected light becomes a horizontally long ellipse 34.

The photodetector has a light receiving portion that is divided into 2×2=4 segments 36 and each of the segments constitutes a light receiving element that outputs a light receiving signal. The photodetector is arranged so that diagonal directions of a 2×2 square arrangement of the light receiving elements, respectively, may coincide with axes of the vertically long ellipse 32 and the horizontally long ellipse 34. When the light receiving elements are thus arranged, in FIGS. 1 through 3, based on a difference between a sum of output signals of two light receiving elements arranged on a diagonal line along a vertical direction and a sum of output signals of two light receiving elements arranged on a diagonal line along a horizontal direction, shapes of the reflected light image as shown in FIGS. 1 through 3 can be distinguished. The shape of the reflected light image can be used to control the distance d. On the other hand, the intensity of light reflected in accordance with data can be obtained from a total sum of output signals of four light receiving elements.

Since a data rate read from an optical disk is very high, the photodetector is constituted of a semiconductor device that uses a PIN photodiode having high response speed. FIG. 4 is a schematic sectional view of an existing photodetector. The drawing expresses a sectional view that goes through two adjacent light receiving elements and is vertical to a semiconductor substrate. The semiconductor device has a $P^+$ region that becomes an anode region 42, which is formed on a surface of a P-type semiconductor substrate 40. Above the anode region 42, an i layer 44 that has a low impurity concentration and high resistivity is formed by an epitaxial growth method. In the i layer 44, at a position corresponding to a boundary of the light receiving elements, an isolation region 46 that is made of a $P^+$ region and continues to the anode region 42 is formed. Furthermore, on a surface of the i layer 44, an $N^+$ region that becomes a cathode region 48 is formed.

The anode region 42, the i layer 44 and the cathode region 48 constitute a PIN photodiode that becomes a light receiving element of a photodetector. The anode region 42 and the cathode region 48, respectively, are connected to voltage terminals and a reverse bias voltage is applied therebetween. In a reverse bias state, in the i layer 44 between the anode region 42 and the cathode region 48, a depletion layer is formed and electrons generated in the depletion layer owing to absorption of incident light move to the cathode region 48 owing to an electric field in the depletion layer, followed by outputting as a receiving light signal. Here, the isolation region 46, as mentioned above, reaches the anode region 42 from a surface of the i layer 44. As a result, the i layer 44 is divided for every light receiving element thus making it possible to inhibit crosstalk between light receiving elements.

A thickness of the i layer 44 is set equal to or more than a substantial absorption length of detecting light in a semiconductor. For instance, an absorption length of silicon to light of a 780 nm or 650 nm band that is used in, for instance, a CD or DVD is substantially 10 to 20 μm. The $P^+$ layer of the isolation region 46 is formed, after the ion implantation, by pressing in a depth direction by means of thermal diffusion. However, at that time, in the thermal diffusion, the $P^+$ region is expanded not only in a depth direction but also in a horizontal direction. In this connection, when the i layer 44 is relatively thick, in order to form an isolation region 46 that is restricted in width, the i layer 44 is formed divided into a plurality of times of epitaxial growth. In this case, every time an epitaxial layer 50 is formed, the ion injection and thermal diffusion are carried out from a surface thereof and thereby an isolation region 52 reaching a bottom surface of the epitaxial layer 50 is formed. When the epitaxial layers 50 and isolation layers 52 are thus layered, the isolation region 46 extending in a depth direction can be formed with a width that is prevented from expanding.

In a semiconductor device that constitutes an existing photodetector, a cathode region 48 is disposed on a surface of a semiconductor substrate, an i layer 44 located below the cathode region 48 forms a depletion layer, and in the depletion layer signal charges are generated by photoelectric conversion. In this configuration, there is a problem in that it is difficult to detect light of an absorption length that is substantially a thickness of the cathode region 48 or less, namely, relatively short in wavelength, for instance, blue light, being absorbed in the cathode region 48. The problem becomes particularly important when an optical disk reproducing device compatible with short wavelength light capable of improving the recording density is being realized.

Furthermore, in a semiconductor device that constitutes an existing photodetector, when a relatively thick i layer such as 10 to 20 μm is formed, the formation of an epitaxial layer 50 and an isolation layer 52 is repeated a plurality of times. Accordingly, there is a problem in that a semiconductor device is high in manufacturing cost. There is a further problem in that, for a part of a junction area of the isolation region 46 and the i layer 44, a capacitance between terminals of an anode and a cathode increases and as a result the high speed responsiveness that is a feature of the PIN photodiode is damaged.

The invention intends to provide a semiconductor device capable of detecting a short wavelength light component and reducing the manufacturing cost and having responsiveness suitable as a photodetector that detects a light signal from an optical disk and so on.

[Patent literature 1] JP-A-10-107243

[Patent literature 2] JP-A-2001-60713

SUMMARY OF THE INVENTION

A semiconductor device according to the invention includes a light receiving semiconductor region that is disposed on a main surface of a semiconductor substrate, receives signal light and has a low impurity concentration; and an anode region and a cathode region that are formed on the main surface with the light receiving semiconductor region interposed therebetween, the anode region being a first conductivity type semiconductor region to which a first voltage is applied and that has an impurity concentration higher than the light receiving semiconductor region, the cathode region being a second conductivity type semiconductor region to which a second voltage is applied and that has an impurity concentration higher than the light receiving semiconductor region, the anode region and the cathode region being put in a reverse bias state owing to the first voltage and the second voltage to form a depletion layer in the light receiving semiconductor region.

DESCRIPTION OF THE PREFERRED EMBODIMENTS

In the following, a mode for carrying out the invention (hereinafter, referred to as embodiment) will be described with reference to the drawings.

Figure 1:
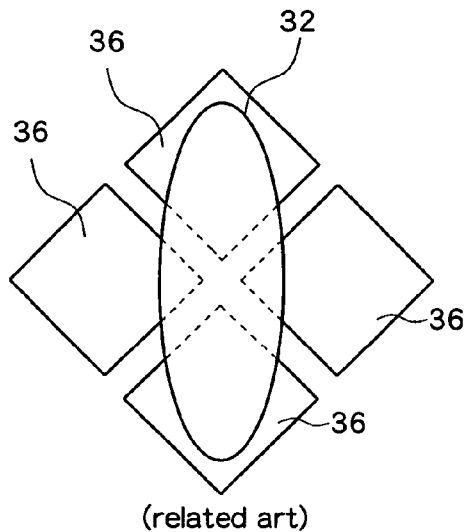
FIG. 1 is a schematic diagram showing a light receiving portion of a photodetector and an image of reflected light when a disk is remote from a target distance.
Figure 2:
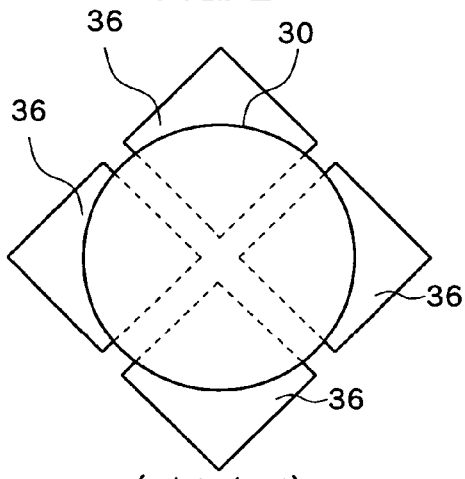
FIG. 2 is a schematic diagram showing a light receiving portion of a photodetector and an image of reflected light on the light receiving portion when a disk is at a target distance.
Figure 3:
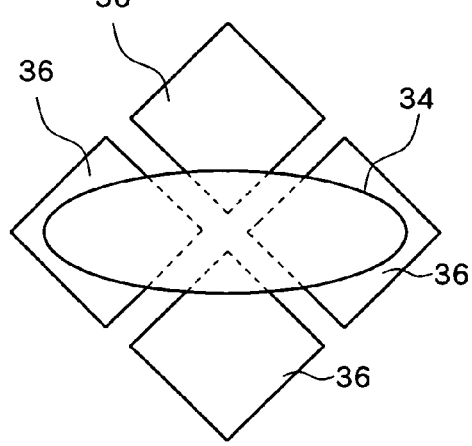
FIG. 3 is a schematic diagram showing a light receiving portion of a photodetector and an image of reflected light when a disk is nearer than a target distance.
Figure 4:
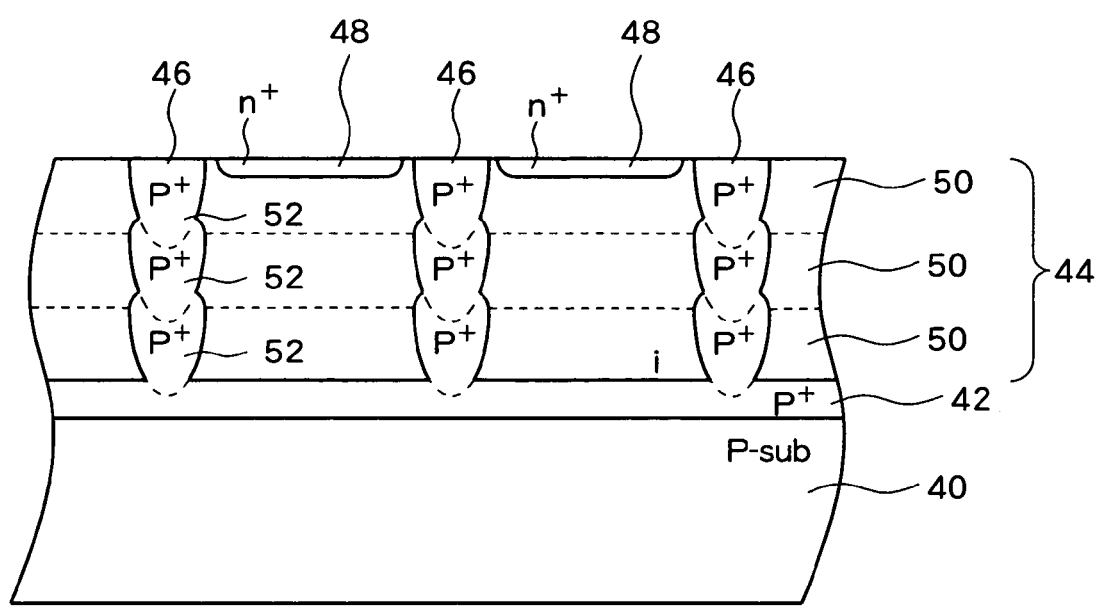
FIG. 4 is a schematic vertical sectional view of an existing photodetector.
Figure 5:
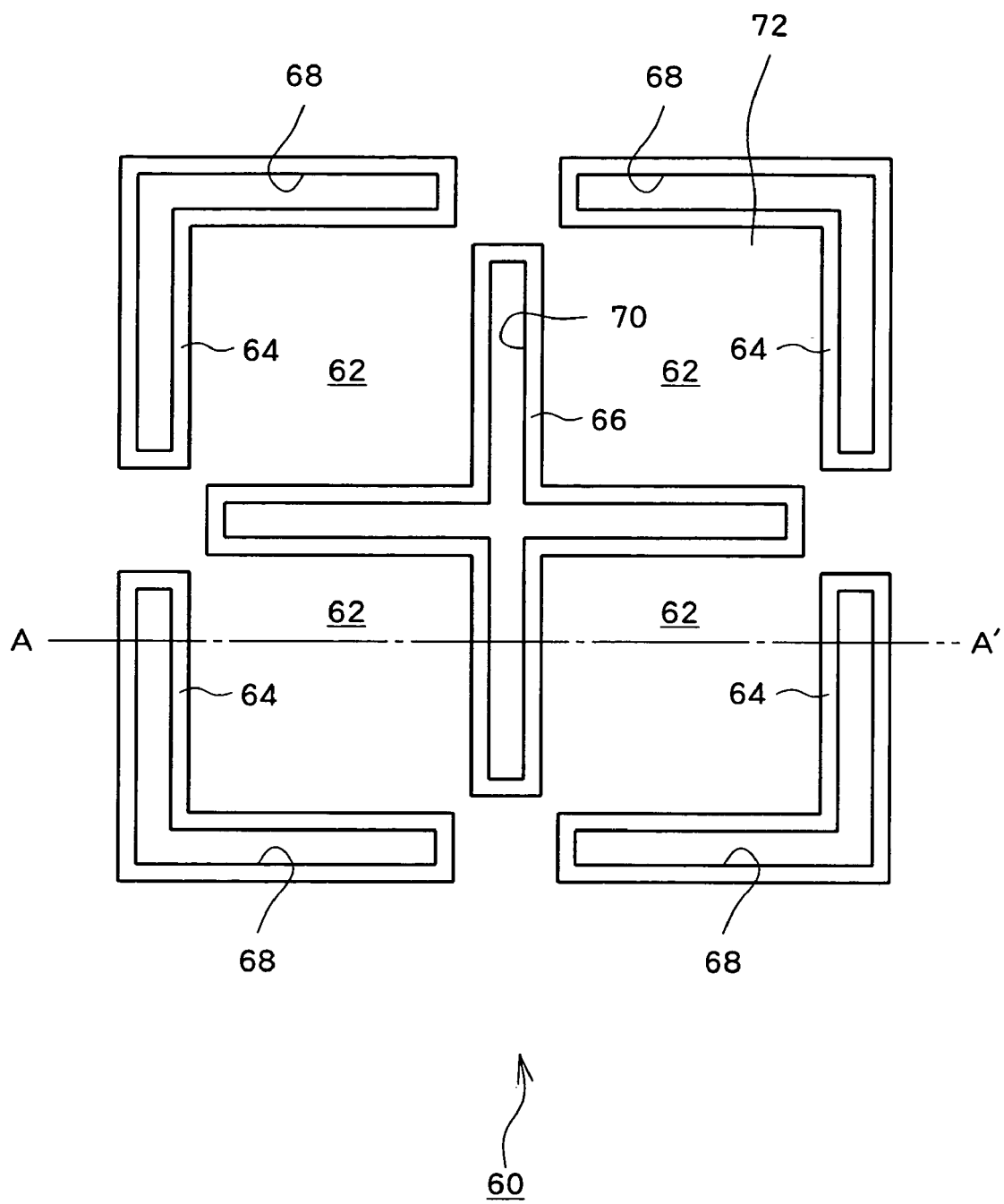
FIG. 5 is a schematic plan view of a photodetector that is a semiconductor device according to an embodiment.

FIG. 5 is a schematic plan view of a photodetector that is a semiconductor element according to the embodiment. A photodetector 60 is formed on a semiconductor substrate made of silicon. A passivation film (not shown in the drawing) layered on a surface of a semiconductor substrate is provided with an opening at a position corresponding to a light receiving portion. The light receiving portion receives light that goes through the opening and enters a surface of the substrate divided into 2×2=4 segments 62.

Corresponding to each of the segments 62, a cathode region 64 (first electrode region) is formed on a surface of the semiconductor substrate. Each of the cathode regions 64 is disposed in an outer periphery of the light receiving portion. Furthermore, on a surface of the semiconductor substrate between the respective segments 62, an anode region 66 (second electrode region) is disposed, and the anode region 66 isolates light receiving elements for every segment 62.

The cathode region 64 is formed as an $N^+$ region where an N type impurity is diffused at a high concentration from a surface of a trench 68 (first groove portion) having, for instance, an L-shaped planar shape along an outer periphery of the light receiving portion. On the other hand, the anode region 66 is formed as a $P^+$ region where a P type impurity is diffused at a high concentration from a surface of a trench 70 (second groove portion) having, for instance, a cross-shaped planar shape formed between the segments 62. Each of the cathode regions 64 is connected through a contact to a wiring (not shown in the drawing) formed of, for instance, an aluminum (Al) layer, and functions as a cathode of a PIN photodiode for every segment 62. On the other hand, the anode region 66 is connected through a contact to wiring (not shown in the drawing), and functions as a common anode to the respective PIN photodiodes.

Figure 6:
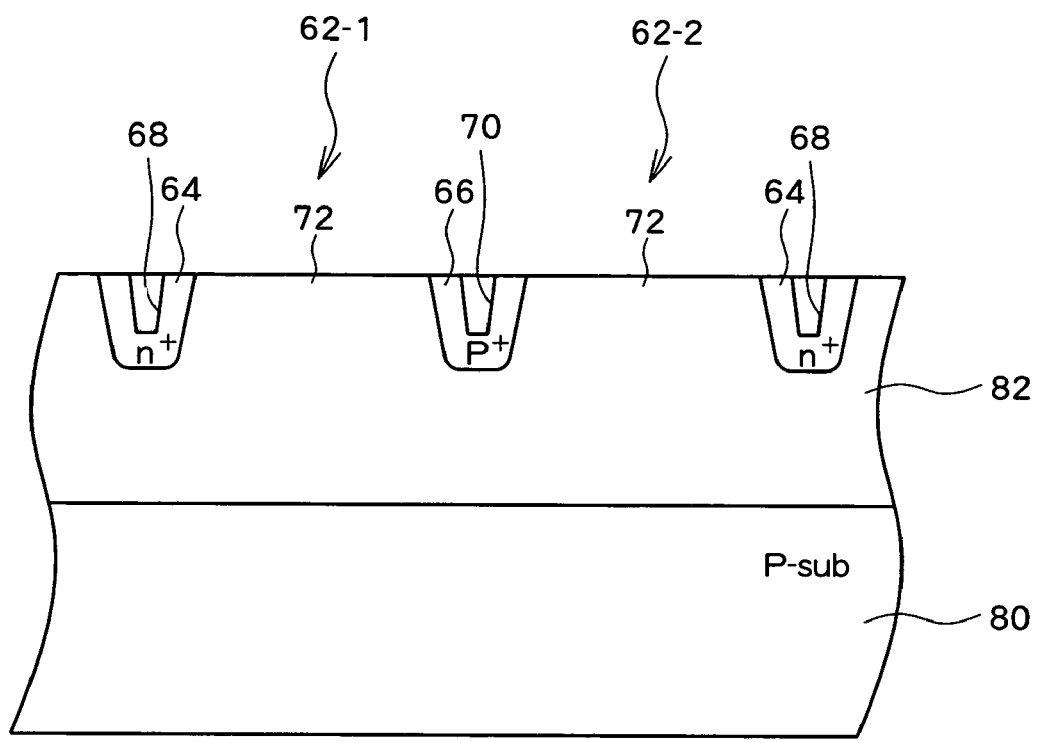
FIG. 6 is a schematic vertical sectional view showing a structure of a light receiving portion according to an embodiment.

FIG. 6 is a schematic sectional view showing the structure of a light receiving portion in a section that goes through a straight line A-A' shown in FIG. 5 and is vertical to the semiconductor substrate. The photodetector 60 is formed with a semiconductor substrate where, on one main surface of a P-sub layer 80 that is, for instance, a P type silicon substrate, a semiconductor layer that has a lower impurity concentration than the P-sub layer 80 and has high resistivity is formed. The high resistivity semiconductor layer layered on the P-sub layer 80 is formed according to, for instance, an epitaxial growth method. The epitaxial layer 82 constitutes an i layer of the PIN photodiode. A low concentration impurity introduced in the epitaxial layer 82 is, for instance, a P type impurity.

The cathode regions 64 and the anode region 66 are formed on a surface of the epitaxial layer 82, the trenches 68 and 70. A surface of the semiconductor substrate is etched to form the trenches 68 and 70. After the trenches 68 and 70 are formed, a photoresist is coated on a surface of the semiconductor substrate, and the photoresist is patterned to form an opening surrounding the trench 68. With the photoresist as a mask, an N type impurity is ion implanted. When an implanting direction is tilted, the ion implantation can be applied onto a sidewall of the trench 68 as well, and as a result a cathode region 64 can be formed on a surface of the trench 68, namely, a sidewall surface and a bottom surface of the trench 68. Similarly, a mask having an opening corresponding to the trench 70 is formed with photoresist, followed by ion implanting a P type impurity, and as a result an anode region 66 is formed on a surface of the trench 70, namely, a sidewall surface and a bottom surface of the trench 70.

The formation processes of the cathode region 64 and anode region 66 can include a thermal diffusion process applied after the ion implantation process, as required. Furthermore, after the cathode region 64 and anode region 66 are formed, an insulating film is buried in the trenches 68 and 70 and as a result a surface of a light receiving portion can be made flat.

As well as constituting a cathode and an anode of a PIN photodiode, as mentioned above, the cathode region 64 and anode region 66 that are formed with the trenches 68 and 70, respectively, also have a function of surrounding each of the segments 62 to isolate a PIN photodiode corresponding to each of the segments 62 from an external semiconductor region. Incidentally, such a configuration is known as an STI (Shallow Trench Isolation) technology.

In an internal portion surrounded by the cathode region 64 and anode region 66 of each of the segments 62, an epitaxial layer 82 appears on a surface. As will be described below, the portion becomes a semiconductor region (light receiving semiconductor region 72) having the sensitivity to incident light to the light receiving portion.

Figure 7:
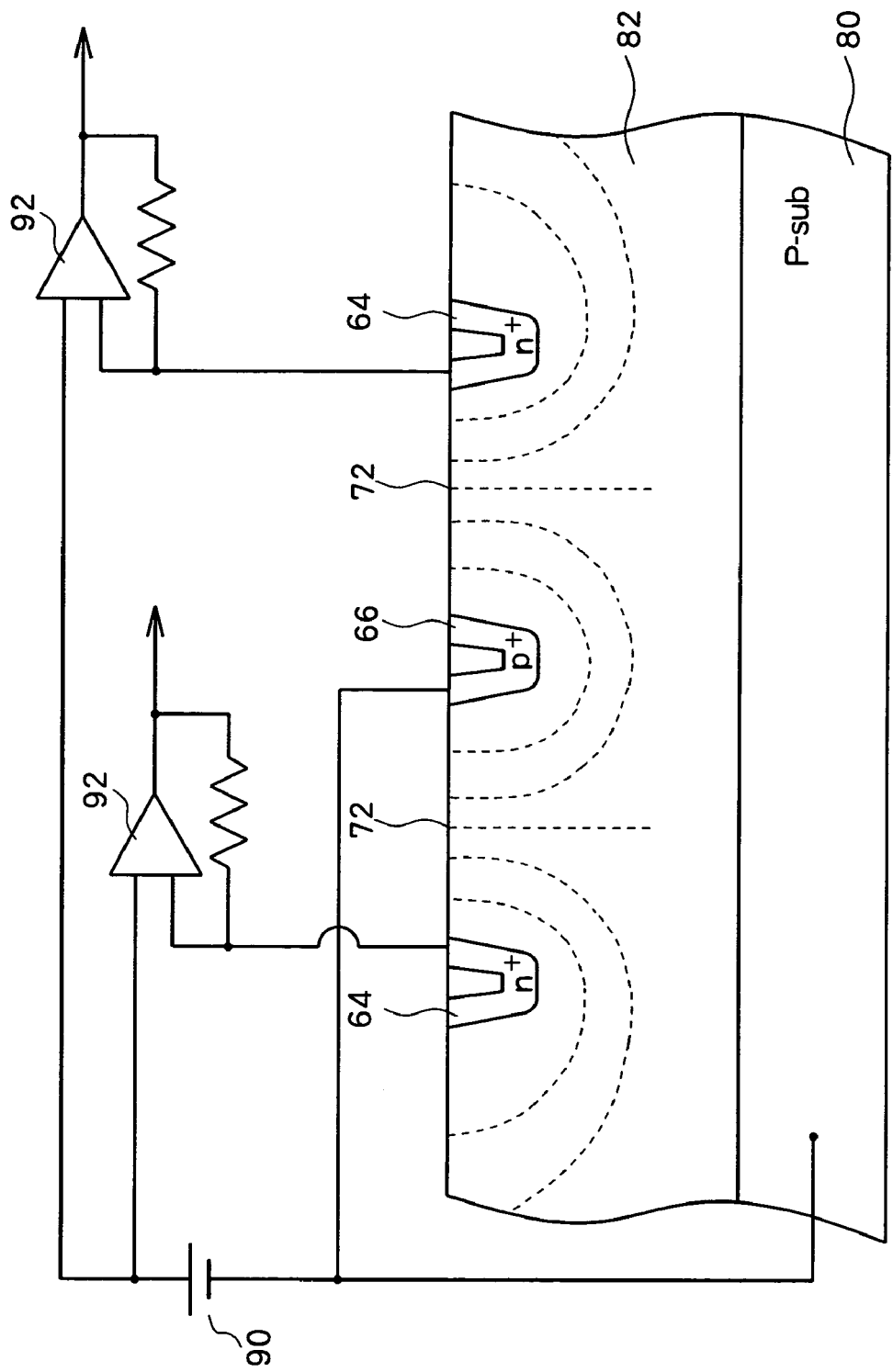
FIG. 7 is a schematic diagram showing a circuit configuration when a photodetector is in operation and a potential distribution in a vertical section.

Operation of the photodetector 60 will now be described. FIG. 7 is a schematic diagram showing a circuit configuration when the photodetector 60 is in operation and a potential distribution in an element section corresponding to FIG. 6. The cathode region 64 is put into a reverse bias state, with respect to the anode region 66 and P-sub layer 80 that are set at a ground potential, by means of a voltage source 90. Specifically, wiring from each of the cathode regions 64 is connected to one input terminal of an operational amplifier 92 and a positive voltage Vb from the voltage source 90 is inputted to the other terminal of the operational amplifier 92. In the operational amplifier 92, an output terminal is connected through a resistance to the cathode region 64 to form a current detector. With this configuration, Vb is applied to the cathode region 64 and a voltage corresponding to the cathode current can be extracted at an output terminal of the operational amplifier 92.

In a section of the photodetector shown in FIG. 7, some equi-potential lines are shown with dotted lines. The sectional view shows that when a reverse bias voltage is applied between an anode and a cathode of a PIN photodiode, a depletion layer expands in an epitaxial layer 82 that constitutes an i layer. In the photodetector 60, both of a cathode region 64 and an anode region 66 are disposed on a surface of a semiconductor substrate, and a light receiving semiconductor region 72 located in the vicinity of a surface of the semiconductor substrate constitutes an i layer between the cathode region 64 and the anode region 66. With this configuration, when a reverse bias voltage is applied, a depletion layer expands in the vicinity of the surface of the semiconductor substrate corresponding to the light receiving semiconductor region 72 as well.

A potential in the depleted layer becomes deeper from the anode region 66 toward the cathode region 64. That is, a potential well is formed at a position corresponding to each of the cathode regions 64. Furthermore, a boundary portion between the segments 62 corresponding to a position of the anode region 66 becomes shallower in potential to form a potential barrier to movement of electrons and as a result element isolation of the PIN photodiode can be realized for every segment 62.

Light incident on each of the segments 62 is absorbed in the depletion layer and generates electron-hole pairs as signal charges and electrons are collected with a nearby cathode region 64. An amount of electrons collected by each of the cathode regions 64 is detected through the operational amplifier 92 as a cathode current. In the photodetector 60, signal charges are also generated by light absorbed in the vicinity of the surface of the semiconductor substrate region 72 and the signal charges can be detected from the cathode region 64. As a result, signal charges generated by short wavelength light absorbed in the vicinity of the surface of the semiconductor substrate can be extracted as the light receiving signal and it is possible to obtain sensitivity to short wavelength light.

Incidentally, when the trenches 68 and 70 are etched using anisotropic etching technology such as RIE (Reactive Ion Etching), the trenches 68 and 70 can be formed slenderly, and as a result an area ratio of a light receiving semiconductor region 72 to a semiconductor substrate surface of each of the segments 62 can be made larger. As a result, the sensitivity of a PIN photodiode in each of the segments 62 can be improved.

Furthermore, since a junction area between the cathode region 64 and anode region 66 and the epitaxial layer 82 can be made smaller, a capacitance between terminals of a cathode and an anode of the PIN photodiode can be kept smaller and excellent responsiveness can be secured.

As the PIN photodiode of each of the segments 62, a semiconductor device according to the invention includes a low impurity concentration light receiving semiconductor region that is disposed on a main surface of a semiconductor substrate and receives signal light, and an anode region and a cathode region formed on the main surface with the light receiving semiconductor region disposed therebetween. The anode region is a first conductivity type semiconductor region that has an impurity concentration higher than the light receiving semiconductor region and to which a first voltage is applied. The cathode region is a second conductivity type semiconductor region that has an impurity concentration higher than the light receiving semiconductor region, and is supplied with a second voltage. The anode region and the cathode region are set to a reverse bias state owing to the first voltage and the second voltage to thus form a depletion layer in the light receiving semiconductor region.

Furthermore, the photodetector is an embodiment of a semiconductor device according to the invention, in which a light receiving portion divided into a plurality of segments is formed on a main surface of a semiconductor substrate. The semiconductor device includes a light receiving semiconductor region having a low impurity concentration and disposed on the main surface, a plurality of first electrode regions disposed on the main surface for each of the segments, and a second electrode region formed on the main surface along a boundary between the segments. The first electrode region is a first conductivity type semiconductor region that has an impurity concentration higher than the light receiving semiconductor region and to which a first voltage is applied. The second electrode region is a second conductivity type semiconductor region that has an impurity concentration higher than the light receiving semiconductor region and to which a second voltage is applied. The first electrode region and the second electrode region are set to a reverse bias state owing to the first voltage and the second voltage and as a result a depletion layer is formed in the light receiving semiconductor region therebetween.

The first electrode region of each segment can be formed along a segment boundary that does not face the other segments. In the photodetector, the cathode region is the first electrode region and the anode region is the second electrode region.

The anode region or the cathode region, as with the photodetector, can be formed on a surface of a groove portion formed on the main surface. Furthermore, the light receiving semiconductor region, like in the photodetector, ca be formed with an epitaxial growth layer.

According to the invention, a PIN photodiode can be constituted with a semiconductor region on a surface of a first groove portion and a semiconductor region on a surface of a second groove portion as an anode and a cathode and with a light receiving semiconductor region therebetween as an i layer. On a surface of the semiconductor substrate interposed between the anode and cathode, a region having a high impurity concentration is not formed and, when the anode and cathode are set in a reverse bias state, a region in the vicinity of a surface of the semiconductor substrate is also depleted. As a result, the anode or cathode can collect charges generated by light having a short wavelength absorbed in the vicinity of the surface of the semiconductor substrate and can extract as a light receiving signal, thus making it possible to obtain sensitivity to the short wavelength light.

Furthermore, according to the invention, in a configuration where a light receiving portion is divided into a plurality of segments, a second groove portion formed at a boundary between the segments fulfills a function of isolating light receiving elements for each of the segments. The second groove portion is formed after a light receiving semiconductor region that becomes an i layer is formed. That is, a process of layering a plurality of epitaxial layers for forming an i layer and a process of forming an isolation region in each of the epitaxial layers, which were described as an existing technology, can be omitted. It is therefore possible to prevent increase in manufacturing cost. The first and second groove portions reach only a partial depth of a light receiving semiconductor region from a surface thereof. Thereby, since a capacitance between terminals of the anode region and the cathode region can be suppressed low, a high-speed response can be attained.

What is claimed is:

1. A semiconductor device comprising:
   a light receiving semiconductor region that is disposed on a main surface of a semiconductor substrate, receives signal light and has a low impurity concentration; and
   an anode region and a cathode region that are formed on a surface of the light receiving semiconductor region apart from each other with the light receiving semiconductor region disposed therebetween the anode region and cathode region extending only to a partial depth of the light receiving semiconductor region,
   wherein the anode region is a first conductivity type semiconductor region to which a first voltage is applied and that has an impurity concentration higher than the light receiving semiconductor region;
   the cathode region is a second conductivity type semiconductor region to which a second voltage is applied and that has an impurity concentration higher than the light receiving semiconductor region;
   the anode region and the cathode region are formed on a surface of a groove portion formed on the main surface of the semiconductor substrate;
   the groove portion is embedded with an insulting film and made flat;
   at least a portion of an uppermost surface of one of the anode region and the cathode region extends in substantially the same plane as an uppermost surface of the light receiving semiconductor region between the anode region and the cathode region;
   the anode region, the light receiving semiconductor region and the cathode region comprise a lateral PIN photodiode; and,
   the anode region and the cathode region are put into a reverse bias state owing to the first voltage and the second voltage to form a depletion layer in the light receiving semiconductor region.

2. The semiconductor device according to claim 1, wherein the light receiving semiconductor region is an epitaxial growth layer.

3. The semiconductor device according to claim 1, wherein at least one of the cathode region and the anode region is substantially U-shaped in cross-section.

4. The semiconductor device according to claim 1, wherein the cathode and anode regions are substantially U-shaped in cross-section.

5. The semiconductor device according to claim 1, wherein the at least a portion of the uppermost surface of one of the anode region and the cathode region extends in substantially the same plane as a majority of an upper surface of the light receiving semiconductor region between the anode region and the cathode region.

6. The semiconductor device according to claim 1, wherein the at least a portion of the uppermost surface of one of the anode region and the cathode region extends in substantially the same plane as an entire upper surface of the light receiving semiconductor region between the anode region and the cathode region.

7. The semiconductor device according to claim 1, wherein the uppermost surfaces of the anode and cathode regions are not in direct contact with the light receiving semiconductor region.

8. A semiconductor device, having a light receiving portion divided into a plurality of segments on a main surface of a semiconductor substrate, comprising:
   a light receiving semiconductor region that is formed on the main surface straddling the segments and has a low impurity concentration;
   a plurality of first electrode regions that are formed on a surface of the light receiving semiconductor region for each of the segments and reach only a partial depth of the light receiving semiconductor region; and
   a second electrode region that is formed on the surface of the light receiving semiconductor region along a boundary between the segments apart from each of the first electrode regions and reaches only a partial depth of the light receiving semiconductor region,
   wherein the first electrode region is a first conductivity type semiconductor region to which a first voltage is applied and that has an impurity concentration higher than the light receiving semiconductor region;
   the second electrode region is a second conductivity type semiconductor region to which a second voltage is applied and that has an impurity concentration higher than the light receiving semiconductor region;
   the first electrode region and the second electrode region are formed on a surface of a groove portion formed on the main surface of the semiconductor substrate;
   the groove portion is embedded with an insulting film and made flat;
   at least a portion of an uppermost surface of one of the first electrode region and the second electrode region extends in substantially the same plane as an uppermost surface of the light receiving semiconductor region between the first electrode region and the second electrode region;

the first electrode region, the second electrode region and the light receiving semiconductor region therebetween are disposed on each of the segments and comprise a lateral PIN photodiode; and, the first electrode region and the second electrode region are put into a reverse bias state owing to the first voltage and the second voltage to form a depletion layer in the light receiving semiconductor region therebetween.

9. The semiconductor device according to claim 8, wherein the first electrode region for each of the segments is formed along a segment boundary that does not face the other segments.

10. The semiconductor device according to claim 8, wherein the first electrode region is a cathode region and the second electrode region is an anode region.

11. The semiconductor device according to claim 8, wherein the light receiving semiconductor region is an epitaxial growth layer.

12. The semiconductor device according to claim 8, wherein the semiconductor substrate comprises the light receiving semiconductor region and an underlayer semiconductor region; and, the light receiving semiconductor region is laminated on one main surface of the underlayer semiconductor region.

13. The semiconductor device according to claim 8, wherein at least one of the first electrode region and the second electrode region is substantially U-shaped in cross-section.

14. The semiconductor device according to claim 8, wherein the first electrode and second electrode regions are substantially U-shaped in cross-section.

15. The semiconductor device according to claim 8, wherein the at least a portion of the uppermost surface of one of the second electrode region and the first electrode region extends in substantially the same plane as a majority of an upper surface of the light receiving semiconductor region between the second electrode region and the first electrode region.

16. The semiconductor device according to claim 8, wherein the at least a portion of the uppermost surface of one of the second electrode region and the first electrode region extends in substantially the same plane as an entire upper surface of the light receiving semiconductor region between the second electrode region and the first electrode region.

17. The semiconductor device according to claim 8, wherein the uppermost surfaces of the second electrode and first electrode regions are not in direct contact with the light receiving semiconductor region.

* * * * *